United States Patent
Lin

(10) Patent No.: US 8,803,601 B2
(45) Date of Patent: Aug. 12, 2014

(54) AMPLIFYING CIRCUIT

(75) Inventor: Hong Wu Lin, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 59 days.

(21) Appl. No.: 13/555,611

(22) Filed: Jul. 23, 2012

(65) Prior Publication Data

US 2013/0069721 A1     Mar. 21, 2013

(30) Foreign Application Priority Data

Sep. 16, 2011     (CN) .......................... 2011 1 0281062

(51) Int. Cl.
*H03F 1/14*     (2006.01)

(52) U.S. Cl.
USPC .......................................................... 330/51

(58) Field of Classification Search
USPC ............................. 330/51; 381/94.5, 120, 121
See application file for complete search history.

(56) References Cited

U.S. PATENT DOCUMENTS

| | | | | |
|---|---|---|---|---|
| 5,151,942 A * | 9/1992 | Sasaki | .......................... | 381/94.5 |
| 6,734,746 B1 * | 5/2004 | Nogi | ............................... | 330/51 |
| 7,915,953 B2 * | 3/2011 | Ryat | ............................... | 330/51 |
| 8,218,793 B2 * | 7/2012 | Tsai et al. | ..................... | 381/120 |
| 2009/0196435 A1 * | 8/2009 | Miao | ........................... | 381/94.5 |

\* cited by examiner

*Primary Examiner* — Khanh V Nguyen
(74) *Attorney, Agent, or Firm* — Gardere Wynne Sewell LLP

(57) ABSTRACT

A circuit includes a first circuit module with a first input node, a second input node and an output node. The first circuit module receives an input signal at the first input node and generates an amplified signal at the output node. The circuit further includes a second circuit module coupled between the output node and a reference potential line. The second circuit selectively draws a current from the output node in response to a first control signal. The first control signal is generated in response to sensing a voltage fluctuation at a power supply node which supplies power to the first circuit module.

16 Claims, 6 Drawing Sheets

AMPLIFYING CIRCUIT

PRIORITY CLAIM

This application claims priority from Chinese Application for Patent No. 201110281062.0 filed Sep. 16, 2011, the disclosure of which is incorporated by reference.

TECHNICAL FIELD

This invention relates generally to electronic circuits, and more particularly to an amplifying circuit used in audio systems.

BACKGROUND

Many audio amplifying circuits generate an audible sound when power supplies for these amplifying circuits significantly fluctuate. For example, when the amplifying circuit is initially powered, the change in the power supply may introduce a noise voltage at an output node of the amplifying circuit. This noise voltage is transferred into a sound via a load coupled to the output node, which is typically audible as a popping noise. This popping noise is a disturbance to users. It would be desirable to eliminate or at least reduce this popping noise.

FIG. 1 shows a conventional audio amplifying circuit 10. The amplifying circuit 10 is supplied by a positive power supply $+V_{supply}$ and a negative power supply $-V_{supply}$, which are configured to provide a symmetrical supply for suppressing the popping noise. Specifically, the audio amplifying circuit 10 comprises an operational amplifier 11 with a non-inverting input node 12, an inverting input node 13 and an output node 14. The non-inverting input node 12 of the operational amplifier 11 is coupled to a first terminal 15 via an input capacitor 16. The first terminal 15 is configured to receive audio signals. The non-inverting node 12 is also coupled to ground via a first resistor 17. The inverting input node 13 of the operational amplifier 11 is coupled to ground via a second resistor 18 and to the output node 14 via a third resistor 19. The second resistor 18 and the third resistor 19 serve as a feedback network for the operational amplifier 11, and the ratio of the resistances of the resistors 18 and 19 determines an amplifying gain for the amplifying circuit 10. The output node 14 of the operational amplifier 11 is coupled to a load 20, typically a loudspeaker capable of producing sounds according to the current flowing therethrough.

While the amplifying circuit 10 is designed to suppress the popping noise, the popping noise can not be fully eliminated, especially when the amplifying circuit 10 is initially powered. FIG. 2 shows an exemplary output stage of the operational amplifier 11 of FIG. 1. As shown in FIG. 2, the operational amplifier comprises an output stage for generating an amplified output signal with high dynamic range. The output stage comprises a first PMOS transistor 21 and a second PMOS transistor 22. The first PMOS transistor 21 is coupled between the positive power supply $+V_{supply}$ and the output node 14 of the operational amplifier, and a gate of the first PMOS transistor 21 is configured to receive the input signal that is amplified by the front stage of the operational amplifier. The second PMOS transistor 22 is coupled between the gate of the first PMOS transistor 21 and the positive power supply $+V_{supply}$, which is configured to control the operation of the first PMOS transistor 21. Due to the device structure of MOS transistors, a parasitic capacitor $C_{gd}$ between the gate and drain of the first PMOS transistor 21 may be coupled into the amplifying circuit. When the amplifying circuit is initially powered, the second PMOS transistor 22 may be turned on, and then the second PMOS transistor 22 and the parasitic capacitor $C_{gd}$ forms a current path permitting a differential current $I_{diff}$ to flow from the positive power supply $+V_{supply}$ to the output node 14, which further flows into the ground via the load 20. The load 20 may generate a significant popping noise in response to the differential current $I_{diff}$.

Thus, there is a need for improving the noise performance of audio amplifying circuits.

SUMMARY

In one aspect, a circuit comprises a first circuit module with a first input node, a second input node and an output node, wherein the first circuit module is configured to receive an input signal at the first input node and generate an amplified signal at the output node. The circuit further comprises a second circuit module coupled between the output node and a reference potential line, configured to draw a current from the output node in response to a first control signal.

In another aspect, an amplifying circuit comprises an embodiment of the circuit according to the invention.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF THE DRAWINGS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 3:
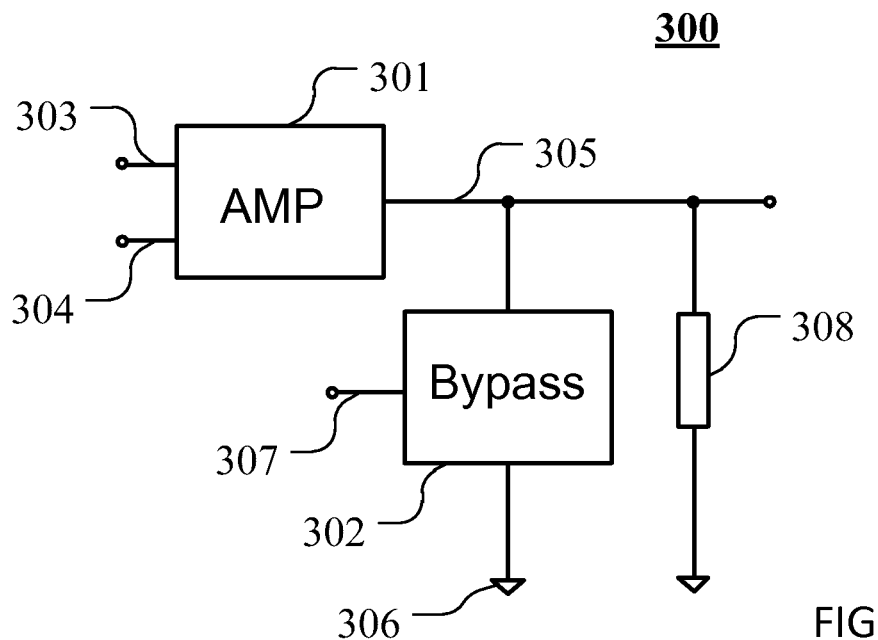
FIG. 3 shows a block diagram of an embodiment of a circuit.

FIG. 3 shows a block diagram of an embodiment of a circuit. In the embodiment, the circuit 300 is used for amplifying signals such as audio signals. In some embodiments, the circuit 300 can be used in, for example, television sets, mobile phones or other electronic products and supplied by corresponding power sources.

As shown in FIG. 3, the circuit 300 according to the embodiment comprises a first circuit module 301 and a second circuit module 302.

The first circuit module 301 has a first input node 303, a second input node 304 and an output node 305. The first circuit module 301 is configured to receive an input signal at the first input node 303 and generate an amplified signal at the output node 305. In an example, the first circuit module 301 may be an integrated operational amplifier with an inverting node and a non-inverting node. It will be appreciated that the first circuit module 301 may be a differential amplifier or other amplifying devices. Moreover, the first circuit module 301 may be supplied by a single power supply or a symmetrical power supply.

The second circuit module 302 is coupled between the output node 305 of the first circuit module 301 and a reference potential line 306. The reference potential line 306 is coupled to, for example, ground or other voltage potential. The second circuit module 302 is configured to draw a current from the output node 305 in response to a first control signal. In an example, the second circuit module 302 has a control node 307 that is configured to receive the first control signal.

In practical applications, the output node 305 of the first circuit module 301 is generally coupled to a load 308, and therefore the amplified signal generated at the output node 305 may generate a current flowing into the reference potential line 306 via the load 308. In this example, the load 308 is a loudspeaker and the current flowing therethrough results in an audible sound. When the first circuit module 301 normally works, the first control signal is in a first state, which causes the second circuit module 302 to be disabled. In this way, the second circuit module 302 is disabled from drawing the current flowing through the output node 305 and the amplified signal can be provided to the load 308 as intended. When the power supply for the first circuit module 301 fluctuates significantly, the first control signal is in a second state being different from the first state, which causes the second circuit module 302 to be enabled. As a result, the second circuit module 302 draws or absorbs the current from the output node 305. In other words, the load 308 is bypassed by the second circuit module 302. As understood by those skilled in the art, a loudspeaker generates sound when a fluctuating current flows therethrough. Since the fluctuating current from the output node 305 is drawn or absorbed by the second circuit module 302 in response to the first control signal being in the second state, there is no fluctuating current flowing through the load 308 and thereby preventing the load 308 from generating audible sound.

Figure 2:
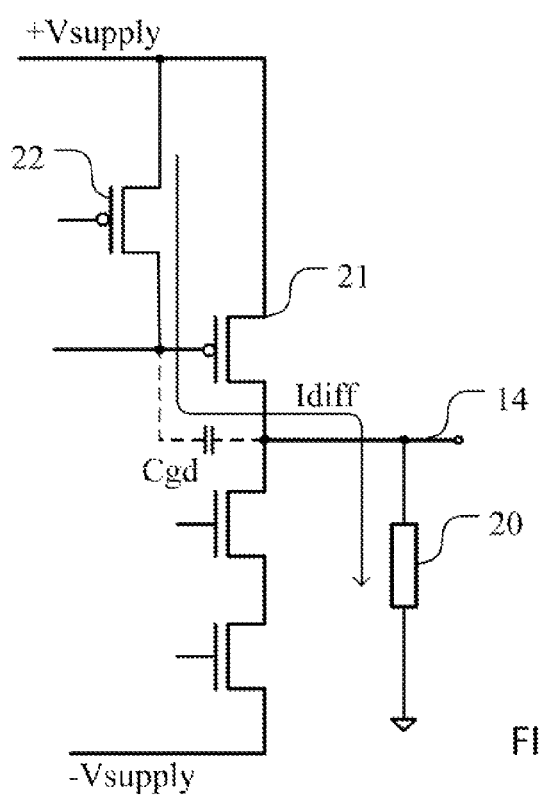
FIG. 2 shows an exemplary output stage of the operational amplifier 11 of FIG. 1.

Take it as an example that the circuit 300 is an integrated operational amplifier with an output stage as shown in FIG. 2. When the differential current $I_{diff}$, for example in the form of a current spike, is introduced into the circuit 300 due to a rising edge of the positive power supply $+V_{supply}$, the second circuit module 302 is turned on in response to a first control signal being in the second state. Thus, the differential current $I_{diff}$ is shunted from the load 308 preventing the load 308 from generating any popping noise. As a result, the circuit 300 has an improved noise performance compared with conventional amplifying circuits.

Figure 4:
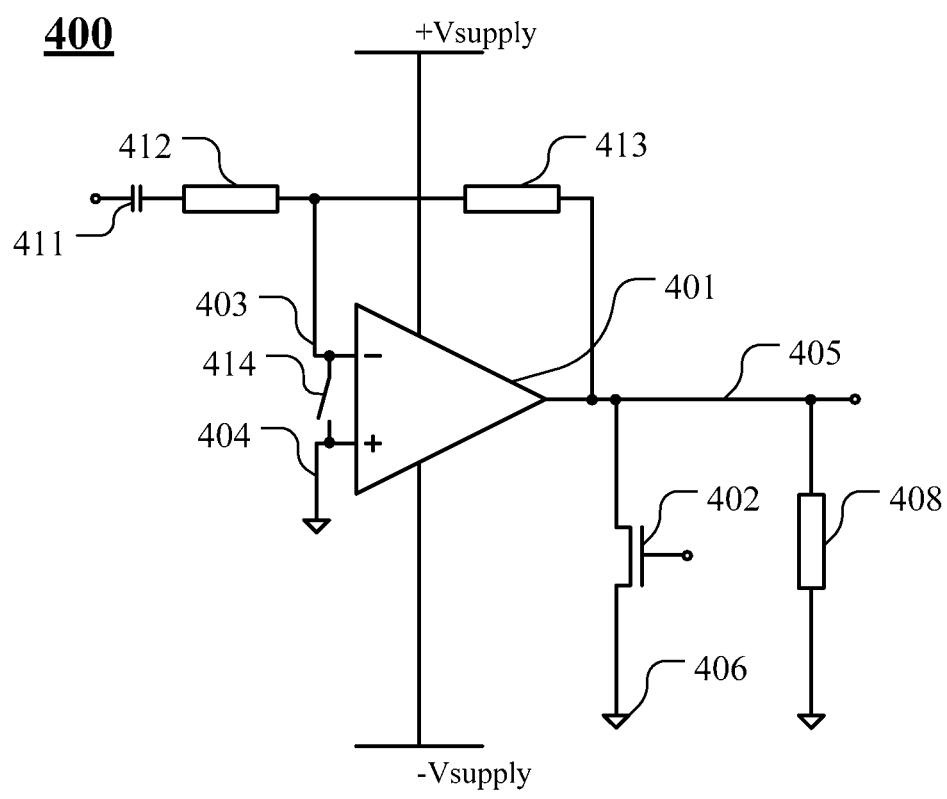
FIG. 4 shows an exemplary detailed schematic of the circuit 300 of FIG. 3.

FIG. 4 shows an exemplary detailed schematic of the circuit 300 of FIG. 3. As shown in FIG. 4, the circuit 400 comprises a first circuit module and a second circuit module.

In detail, the first circuit module comprises a first operational amplifier 401 with an inverting node 403, a non-inverting node 404 and an output node 405. The inverting node 403 is configured to receive an input signal via a capacitor 411 and a first resistor 412, wherein the capacitor 411 and the first resistor 412 are series coupled. The inverting node 403 is also coupled to the output node 405 via a second resistor 413. An amplifying gain of the first circuit module is determined by a ratio of the resistances of the first resistor 412 and the second resistor 413.

The second circuit module comprises a first MOS transistor 402 of a first conductive type. A gate of the first MOS transistor 402 is coupled to a first control signal, a source of the first MOS transistor 402 is coupled to a reference potential line 406, and a drain of the first MOS transistor 402 is coupled to the output node 405. The first MOS transistor 402 is configured to operate in response to the first control signal. Specifically, when the gate of the first MOS transistor 402 receives a first control signal being in a first state which causes the first MOS transistor 402 to be turned off, the first MOS transistor 402 will function as a resistor of high impedance, and it will not influence the outputting of an amplified signal at the output node 405. However, when the gate of the first MOS transistor 402 receives a first control signal being in a second state which causes the first MOS transistor 402 to be turned on, the first MOS transistor 402 will function as a resistor of low impedance, which couples the output node 405 to the reference potential line 406 directly. Thus, the current from the output node 405 is shunted from the load 408.

The first MOS transistor 402 also comprises a body diode reversely coupled between the output node and the reference potential line so that its body diode prevents the current from the output node 405 flowing through the first MOS transistor 402 when the first MOS transistor 402 is turned off. In the embodiment of FIG. 4, the first MOS transistor 402 is an NMOS transistor. Under this condition, there will be no current path through the second circuit module when it is turned off, so that the amplified signal at the output node 405 can be provided to the load 408 without loss.

Figure 5:
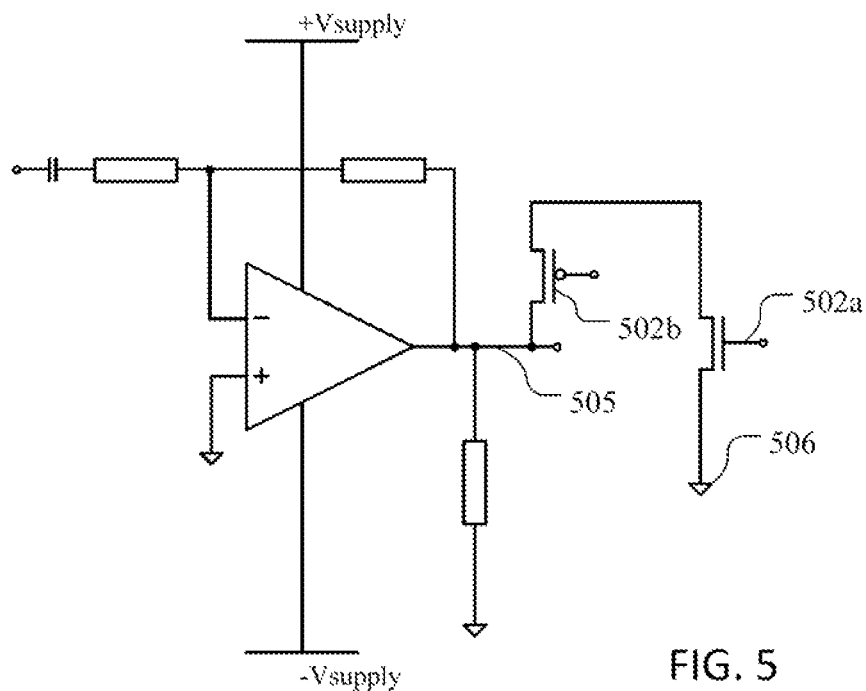
FIG. 5 shows another exemplary detailed schematic of the circuit in FIG. 3.

FIG. 5 shows exemplary detailed schematic of the circuit in FIG. 3.

As shown in FIG. 5, the second circuit module comprises a first MOS transistor 502a of a first conductive type, and a second MOS transistor 502b of a second conductive type that is coupled in series with the first MOS transistor 502a between the output node 505 of the first circuit module and the reference potential line 506. A gate of the second MOS transistor 502b is coupled to the first control signal. The second MOS transistor 502b is turned on or off simultaneously with the first MOS transistor 502a in response to the first control signal. Moreover, a body diode of the second MOS transistor 502b is oppositely coupled with the body diode of the first MOS transistor 502a so that the body diode of the second MOS transistor 502b and the body diode of the first MOS transistor 502a prevent each other from conducting when the MOS transistors 502a and 502b are turned off. In the example of FIG. 5, the first MOS transistor 502a is an NMOS transistor and the second MOS transistor 502b is a PMOS transistor.

Still referring to FIG. 4, in an embodiment, the first circuit module 401 further comprises a switch 414 coupled between the first input node 403 and the second input node 404. The switch 414 is configured to operate in response to a second control signal. In operation, when the second control signal is in a first state, the switch is turned off, and therefore the switch will not influence the operation of the first circuit module 401. When the second control signal is in a second state, the switch 414 is turned on and the input nodes 403 and 404 are coupled to each other, so that no voltage difference is applied between the input nodes of the first circuit module 401. As a result, there will be no amplified signal at the output node 405 and no sound can be given out by the load 408 coupled to the output node 405. Thus, the circuit 400 is muted.

It should be appreciated that the switch 414 is optional but not necessary. The switch 414 may be provided for the purpose of further reducing noise or other purposes.

In an example, the second control signal is in the same logic state as the first control signal. Under this condition, the switch 414 and the second circuit module 402 are configured to operate in response to the same control signal. In operation, when the first control signal is in the second state, the MOS transistor 402 is turned on and thereby shunting the current from the load 408. At the same time, the switch 414 is also turned on which further ensures that there will be no fluctuating current flowing through the load 408. Preferably, the switch 414 comprises a MOS transistor. The MOS transistor is arranged so that a body diode of the MOS transistor prevents the current flowing from the first input node 403 to the second input node when the MOS transistor is turn off. Such configuration can further improve the noise suppression performance of the circuit 400.

In another example, the second control signal may be user enabled or disabled. If desired, for example, when the user is answering a call, he/she can enable the second control signal to mute the loudspeaker.

Figure 6:
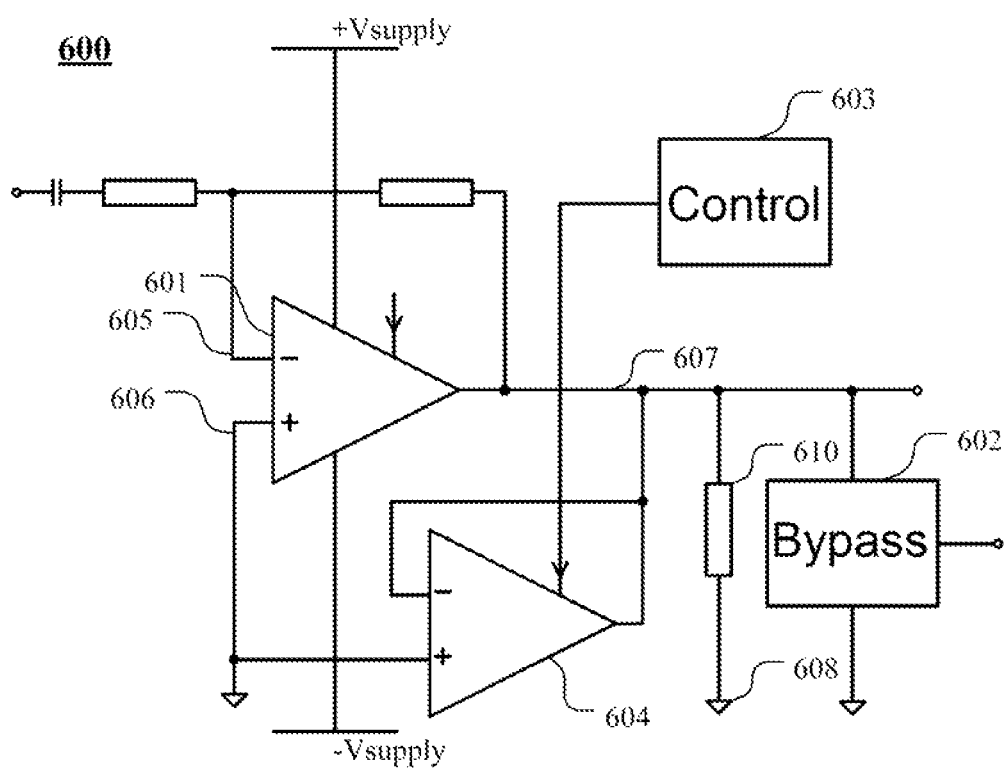
FIG. 6 shows a block diagram of another embodiment of a circuit.

FIG. 6 shows a block diagram of another embodiment of a circuit 600.

As shown in FIG. 6, the circuit 600 comprises a first circuit module 601, a second circuit module 602, a controller 603 and a coupler 604.

The first circuit module 601 has a first input node 605, a second input node 606 and an output node 607. The first circuit module 601 is configured to receive an input signal at the first input node 605 and to generate an amplified signal at the output node 607.

The second circuit module 602 is coupled between the output node 607 and a reference potential line 608. The second circuit module 602 is configured to draw a current from the output node 607 in response to a first control signal.

The coupler 604 is configured to couple the output node 607 of the first circuit module 601 to the reference potential line 608 in response to an output of the controller 603. In the embodiment, the coupler 604 comprises a voltage follower coupled between the output node 607 and the reference potential line 608. Preferably, the coupler 604 comprises a second operational amplifier with an inverting node, a non-inverting node and an output node. The non-inverting node of the second operational amplifier is coupled to the reference potential line 608, the inverting node and output node of the second operational amplifier are coupled to the output node of the first circuit module 601.

In operation, the coupler 604 is responsive to the output of the controller 603 which enables the circuit 600 to operate in a mute mode or in an un-mute mode. In detail, when the output of the controller 603 is in a first state, the coupler 604 is turned off so that the circuit 600 operates in the un-mute mode. Then the amplified signal generated at the output node 607 is provided to a load 610. When the output of the controller 603 is in a second state, the coupler 604 is turned on so that the circuit 600 operates in the mute mode. Then the output node 607 is directly connected to the reference potential line 608. Thus, no sound can be given out by the load 610.

In an embodiment, the controller 603 is configured to generate a first bias current and a second bias current that are complementary to each other, the first circuit module 601 comprises a first amplifier whose input bias current is mirrored from the first bias current, and the coupler 604 comprises a second amplifier whose input bias current is mirrored from the second bias current. Since the first bias current and the second bias current are complementary to each other, the first circuit module 601 tends to be turned off in response to the first bias current being at low amplitude while the coupler 604 tends to be turned on in response to the second bias current being at high amplitude, and vice versa.

In detail, when the output of the controller 603 is in a first state, the first bias current is at high amplitude and the second bias current is at low amplitude. As a result, the first circuit module 601 is turned on and the coupler 604 is turned off. In such case, the first circuit module 601 amplifies an input signal received at the first input node 605 and generates an amplified signal at the output node 607. When the output of the controller 603 is in a second state, the first bias current is at low amplitude and the second bias current is at high amplitude. As a result, the first circuit module 601 tends to be turned off and the coupler 604 tends to be turned on. In such case, the voltage at the output node 607 is gradually "short connected" to the reference line.

Figure 7:
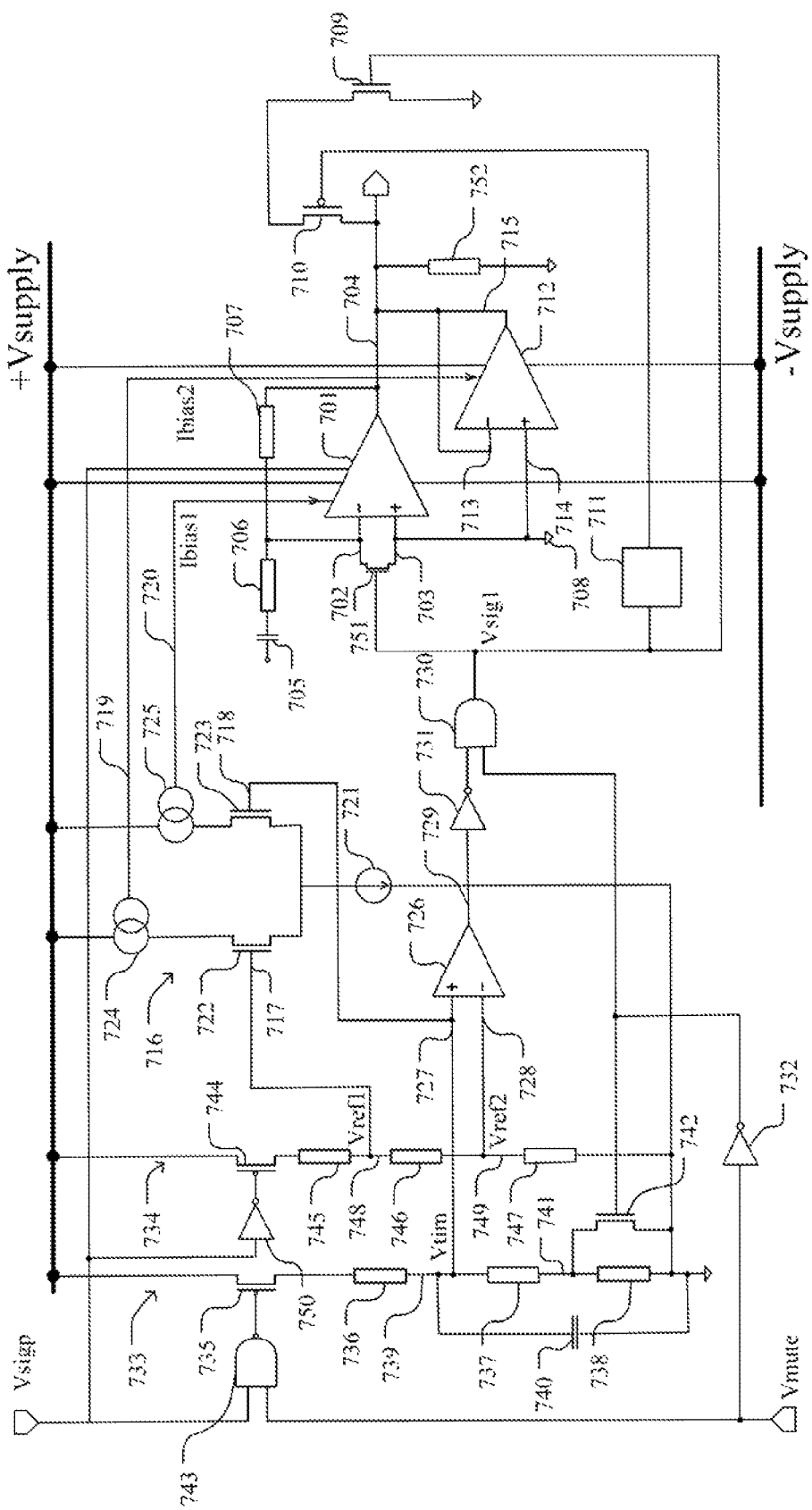
FIG. 7 shows an exemplary detailed schematic of the circuit of FIG. 6.

FIG. 7 shows an exemplary detailed schematic of the circuit 600 of FIG. 6.

As shown in FIG. 7, the circuit comprises a first circuit module, a second circuit module, a controller and a coupler.

The first circuit module comprises a first operational amplifier 701 with a first input node 702, a second input node 703 and an output node 704. The first input node 702 is configured to receive an input signal via a first capacitor 705 and a first resistor 706 coupled in series. The first input node 706 is also coupled to the output node 704 via a second resistor 707. The second input node 703 is coupled to a reference potential line 708. In an example, the first operational amplifier 701 is supplied by a positive power supply $+V_{supply}$ and a negative power supply $-V_{supply}$.

In the embodiment, the first operational amplifier 701 is configured to receive a first biasing current $I_{bias1}$ so that the operation of the first operational amplifier 701 can be controlled accordingly. In detail, the first bias current $I_{bias1}$ is configured to be supplied to the first operational amplifier 701 so that the open loop gain of the first operational amplifier 701 varies in response to the first bias current $I_{bias1}$. The power control signal $V_{sigp}$ is configured to turn on or off an output stage of the first operational amplifier 701, as will be discussed hereinafter. Moreover, the first circuit module further comprises an third MOS transistor 751 coupled between the first input node 702 and the second input node 703, which is configured to operate in response to the first control signal $V_{sig1}$.

The second circuit component comprises a first MOS transistor 709 of a first conductive type, and a second MOS transistor 710 of a second conductive type that is coupled in series with the first MOS transistor 709 between the output node 704 and the reference potential line 708. A gate of the first MOS transistor 709 is coupled to the first control signal $V_{sig1}$ and a gate of the second MOS transistor 710 is coupled to a first control signal $V_{sig1}$ via a shifter 711. The shifter 711 is configured to change the amplitude of the first control signal Vsig1 as well as to invert first control signal $V_{sig1}$.

Then, the first MOS transistor 709 and the second MOS transistor 710 can be turned on or off simultaneously. In the embodiment of FIG. 7, the first MOS transistor 709 is an NMOS transistor and the second MOS transistor 710 is a PMOS transistor. Preferably, the second MOS transistor 710 is a PMOS transistor with a drift region, which has a high dynamic output range.

The coupler comprises a second operational amplifier 712 with an inverting node 713, a non-inverting node 714 and an output node 715. The non-inverting node 714 is coupled to the reference potential line 708, and the inverting node 713 and the output node 715 of the second operational amplifier 712 is coupled to the output node 704 of the first operational amplifier 701. Thus, the output node 715 can be coupled to the reference potential line 708 when the second operational amplifier 712 is turned on. In the embodiment, the second operational amplifier 712 is configured to receive a second biasing current $I_{bias2}$, which is configured to be supplied to the second operational amplifier 712 so that the open loop gain of the second operational amplifier 712 varies in response to the second bias current $I_{bias2}$. Moreover, the second bias current $I_{bias2}$ is complementary to the first bias current $I_{bias1}$, i.e., the sum of the first bias current $I_{bias1}$ and the second bias current $I_{bias2}$ is constant.

The controller comprises a first comparator 716 with a first input node 717, a second input node 718, a first output node 719 and a second output node 720. The first comparator 716 is configured to compare a voltage difference between the input nodes 717 and 718, and to generate the first bias current $I_{bias1}$ at the first node 719 and the second bias current $I_{bias2}$ at the second output node 720 according to the comparison. In detail, the first input node 717 is configured to receive a first reference signal $V_{ref1}$ and a timing signal $V_{tim}$. When the first reference signal $V_{ref1}$ exceeds the timing signal $V_{tim}$, the first comparator 716 will generate the first bias current $I_{bias1}$ that is bigger than the second bias current $I_{bias2}$. When the timing signal $V_{tim}$ exceeds the first reference signal $V_{ref1}$, the first comparator 716 will generate the second bias current $I_{bias2}$ that is bigger than the first bias current $I_{bias1}$. Moreover, the difference between the first and second bias currents is in proportion to the voltage difference between the first reference signal $V_{ref1}$ and the timing signal $V_{tim}$.

In the embodiment of FIG. 7, the first comparator 716 comprises a current source 721, a fifth MOS transistor 722, a fourth MOS transistor 723, a first current mirror 724 and a second current mirror 725. The third and fifth MOS transistors 722 and 723 is coupled to each other as a differential input stage, wherein a gate of the fifth MOS transistor 722 is configured to receive the first reference signal $V_{ref1}$ and a gate of the fourth MOS transistor 723 is configured to receive the timing signal $V_{tim}$. A source of the fifth MOS transistor 722 and a source of the fourth MOS transistor 723 are coupled to the current source 721 so that the differential input stage may be biased by the current source 721. It will be appreciated that a first output current may be generated at a drain of the fifth MOS transistor 722, and a second output current may be generated at a drain of the fourth MOS transistor 723. The first and second output currents are further mirrored by the first and second current mirrors 724 and 725 respectively so that the first and second bias currents $I_{bias1}$ and $I_{bias2}$ being complementary to each other can be generated. The bias currents $I_{bias1}$ and $I_{bias2}$ are further provided to the first and second operational amplifiers 701 and 712 as described in the previous paragraphs.

The controller further comprises a second comparator 726, which is configured to generate the first control signal $V_{sig1}$. In detail, the second comparator 726 has a first input node 727, a second input node 728 and an output node 729, wherein the first input node 727 is configured to receive the timing signal $V_{tim}$ and the second input node 728 is configured to receive a second reference signal $V_{ref2}$. The output node 729 is coupled to an AND gate 730 via a first inverter 731. The AND gate 730 further receives a mute control signal $V_{mute}$ via a second inverter 732. Then, the first control signal $V_{sig1}$ is generated at the output of the AND gate 730 and provided to the first MOS transistor 709 and the second MOS transistor 710.

The circuit further comprises a reference module that is configured to receive the power control signal $V_{sigp}$ and the mute control signal $V_{mute}$ and to generate the timing signal $V_{tim}$, the first reference signal $V_{ref1}$ and the second reference signal $V_{ref2}$ according to the power control signal $V_{sigp}$ and the mute control signal $V_{mute}$.

In the embodiment, the reference module comprises a first loop 733 and a second loop 734 that are coupled between the positive power supply $+V_{supply}$ and the reference potential line 708.

In detail, the first loop 733 has an eighth MOS transistor 735, a third resistor 736, a fourth resistor 737 and a fifth resistor 738 that are coupled in series. A first common node 739 between the third resistor 736 and the fourth resistor 737 is further coupled to the reference potential line 708 via a second capacitor 740. The timing signal $V_{tim}$ is the voltage on the second capacitor 740. The first common node 739 is also coupled to the second input node 718 of the first comparator 716 and the first input node 727 of the second comparator 726 to provide the timing signal $V_{tim}$. A second common node 741 between the fourth resistor 737 and the fifth resistor 738 is coupled to the reference potential line 708 via a sixth MOS transistor 742, wherein a gate of the sixth MOS transistor 742 is configured to receive the mute control signal $V_{mute}$ via the second inverter 732. Moreover, a gate of the eighth MOS transistor 735 is configured to receive the power control signal $V_{sigp}$ and the mute control signal $V_{mute}$ via a NAND gate 743. The operation of the first loop 733 is responsive to the combination of the power control signal $V_{sigp}$ and the mute control signal $V_{mute}$.

The second loop 734 comprises a seventh MOS transistor 744, an eighth resistor 745, a ninth resistor 746 and a tenth resistor 747 that are coupled in series. A third common node 748 between the eighth resistor 745 and the ninth resistor 746 is coupled to the gate of the first input node 717 of the first comparator 716 to provide the first reference signal $V_{ref1}$ thereto. A fourth common node 749 between the ninth resistor 746 and the tenth resistor 747 is coupled to the second input node 728 of the second comparator 726 to provide the second reference signal $V_{ref2}$ thereto. A gate of the seventh MOS transistor 744 is configured to receive the power control signal $V_{sigp}$ via a third inverter 750.

From the foregoing, the circuit may operate in different modes in response to the power control signal $V_{sigp}$ and the mute control signal $V_{mute}$. Hereinafter, the operating process of the circuit shown in FIG. 7 will be elaborated.

When both of the power control signal $V_{sigp}$ and the mute control signal $V_{mute}$ are in a first state, for example, the power control signal $V_{sigp}$ is '0' and the mute control signal $V_{mute}$ is also '0', the circuit operates in a shut-off mode.

Figure 1:
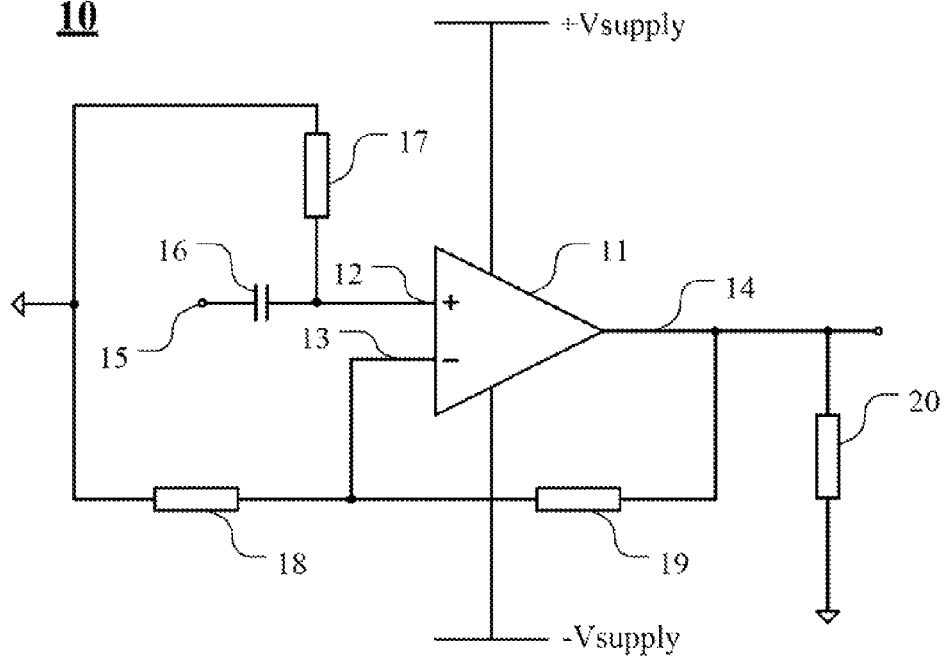
FIG. 1 shows a conventional audio amplifying circuit 10.

In the shut-off mode, the eighth MOS transistor 735 and the sixth MOS transistor 742 are turned off, which causes the first loop 733 and the second loop 734 to be open. Thus, the first common node 739, the fourth common node 749 are coupled to the reference potential line 708 so that the timing signal $V_{tim}$ and the second reference signal $V_{ref2}$ are '0'. Accordingly, the voltage at the output node 729 of the second comparator 726 is '0', and therefore the first control signal $V_{sig1}$ at the output node of the AND gate 730 is '1', which causes the first MOS transistor 709, the second MOS transistor 710 and the third MOS transistor 751 to be turned on. In this way, when the differential current in FIG. 2 is generated due to the fluctuation of the positive power supply +$V_{supply}$, the first MOS transistor 709 and the second MOS transistor 710 provide a path that enables the differential current to be drawn from the output node 704 to the reference potential line 708. Furthermore, the first input node 703 and the second input node 704 of the first operational amplifier 701 are coupled together because the third MOS transistor 751 is turned on, so that the first operational amplifier 701 is prevented from amplifying any noise at the input nodes 703 and 704. As a result, the circuit has a better noise suppression performance than the circuit 10 in FIG. 1.

When the power control signal $V_{sigp}$ is in a second state and the mute control signal $V_{mute}$ is in a first state, for example, the power control signal $V_{sigp}$ is '1' and the mute control signal $V_{mute}$ is '0', the circuit operates in a mute mode.

In the mute mode, the eighth MOS transistor 735 is turned off, which causes the first loop 733 to be open. The sixth MOS transistor 742 is turned on, which causes the second loop 734 to be closed. Thus, the first common node 739 is still coupled to the reference potential line 708 while the fourth common node 749 is coupled between the positive power supply +$V_{supply}$ and the reference potential line 708, so that the timing signal $V_{tim}$ is lower than both of the first reference signal $V_{ref1}$ and the second reference signal $V_{ref2}$. Accordingly, the first bias current $I_{bias1}$ is significantly lower than the second bias current $I_{bias2}$. As a result, the first operational amplifier 701 tends to be turned off and the second operational amplifier 712 tends to be turned on. In this way, in other words, the second amplifier 712 has more effect on the voltage at the output node 704 so that the voltage at the output node 704 is pulled down to the level of ground. Therefore, the loudspeaker 752 is muted. Moreover, as the timing signal $V_{tim}$ is lower than the second reference signal $V_{ref2}$, the output node 729 of the second comparator 726 is '0' and the first control signal $V_{sig1}$ at the output node of the AND gate 730 is '1', which causes the first MOS transistor 709, the second MOS transistor 710 and the third MOS transistor 751 to be turned on.

When both of the power control signal $V_{sigp}$ and the mute control signal $V_{mute}$ are in a second state, for example, the power control signal $V_{sigp}$ is '1' and the mute control signal $V_{mute}$ is '1', the circuit operates in an un-mute mode.

In the un-mute mode, both of the eighth MOS transistor 735 and the seventh MOS transistor 744 are turned on, which causes the first loop 733 and the second loop 734 to be closed. Thus, the second capacitor 740 coupled between the first common node 739 and the reference potential line 708 is charged, so that the timing signal $V_{tim}$ at the first common node 739 gradually increases. As understood by those skilled in the art, the transconductance of the fourth MOS transistor 723 becomes higher as the gate voltage, i.e. the timing signal $V_{tim}$, increases. In this way, the first bias current $I_{bias1}$ gradually increases while the second bias current $I_{bias2}$ gradually decreases. As a result, the first amplifier 701 tends to be turned on while the second amplifier 712 tends to be turned off. In other words, the first amplifier 701 has more effect on the voltage at the output node 704 as the timing signal $V_{tim}$ gradually increases, and the loudspeaker 752 is gradually un-muted so that popping noise is eliminated or at least alleviated when changing the amplifier from mute mode to un-mute mode.

It will be appreciated that the charging of the second capacitor 740 can be set by adjusting the resistances of the resistors 736, 737 and 738. In this embodiment, the threshold voltage is pre-set to be bigger than the first reference signal $V_{ref1}$. Moreover, once the mute control signal $V_{mute}$ change to '1', the first control signal remains '0', which causes the first MOS transistor 709, the second MOS transistor 710 and the third MOS transistor 751 to be kept off.

Figure 8:
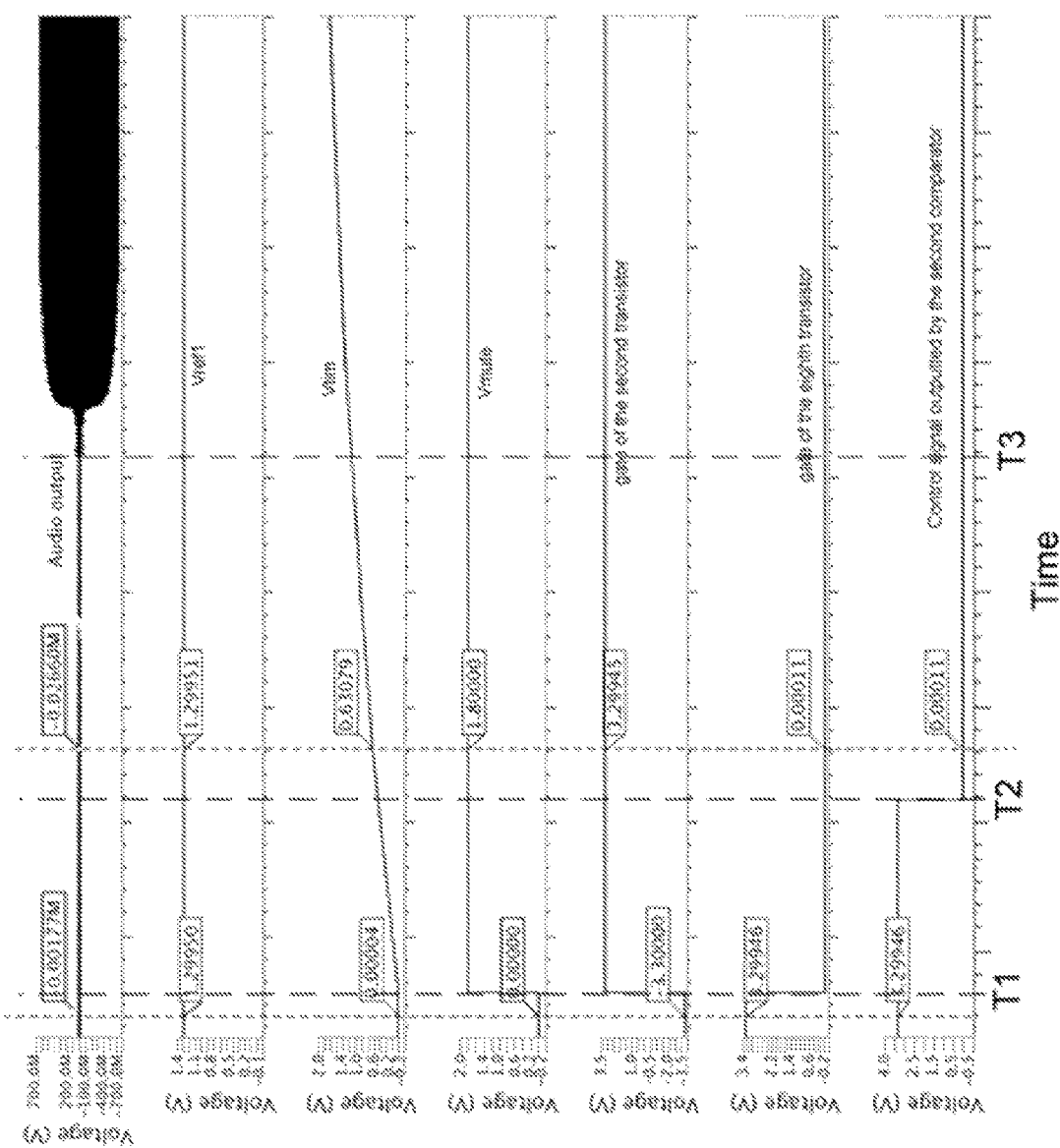
FIGS. 8 and 9 show exemplary operation of the circuit in FIG. 7.
Figure 9:
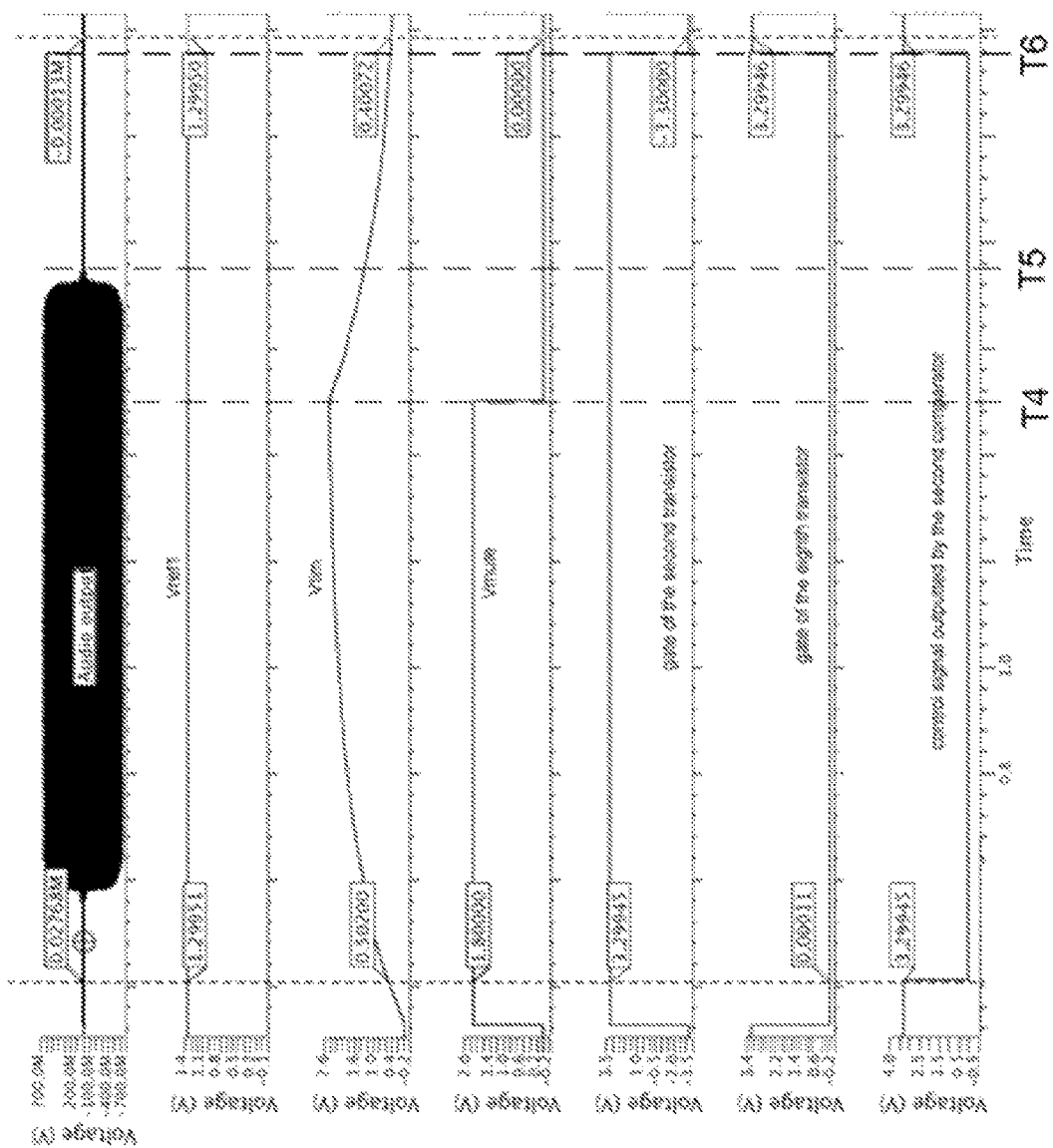

FIGS. 8 and 9 show exemplary operation of the circuit in FIG. 7.

As shown in FIG. 8, the circuit operates from the mute mode to the un-mute mode in response to the mute control signal $V_{mute}$. Specifically, at a first time T1, the mute control signal $V_{mute}$ switches from '0' to '1', which causes the second capacitor to be charged gradually. Thus, the timing signal $V_{tim}$ on the second capacitor increases gradually. At a second time T2, the timing signal $V_{tim}$ exceeds the second reference signal $V_{ref2}$, and therefore the voltage at the output node of the second comparator changes accordingly. However, since the timing signal $V_{tim}$ is still lower than the first reference signal $V_{ref1}$, the output of the first comparator remains to provide the first bias current of low amplitude. Thus, the first operational amplifier is still turned off and no amplified signal can be given out at its output node. At a third time T3, the timing signal $V_{tim}$ exceeds the first reference signal $V_{ref1}$ so that the first biasing current for biasing the first operational amplifier increases gradually. In this way, the first operational amplifier is turned on gradually to generate the amplified signal so that popping noise is eliminated or at least alleviated.

As shown in FIG. 9, the circuit operates from the mute mode to the un-mute mode and back to the mute mode in response to the mute control signal $V_{mute}$. Specifically, prior to a fourth time T4, the circuit is responsive to the mute control signal $V_{mute}$ to switch from the mute mode to the un-mute mode in a manner being similar to the operation described above with reference to FIG. 8, and therefore the details thereof will not be repeated. At the fourth time T4 when the mute control signal $V_{mute}$ switches from '1' to '0', the timing signal $V_{tim}$ begins to decrease gradually due to the discharging of the second capacitor. At a fifth time T5, the timing signal $V_{tim}$ decrease below the first reference signal $V_{ref1}$, which causes the first bias current to decrease gradually. Then the first operational amplifier is turned off gradually so that popping noise is eliminated or at least alleviated.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
    a first circuit module with a first input node, a second input node and an output node, wherein the first circuit module is configured to receive an input signal at the first input node and generate an amplified signal at the output node; and
    a second circuit module coupled between the output node and a reference potential line, configured to draw a current from the output node in response to a first control signal;

wherein the second circuit module comprises a first MOS transistor of a first conductive type, a gate of the first MOS transistor being coupled to receive the first control signal; and wherein the second circuit module further comprises a second MOS transistor of a second conductive type, coupled in series with the first MOS transistor, a gate of the second MOS transistor being coupled to receive an inverted signal of the first control signal.

2. A circuit, comprising:
a first circuit module with a first input node, a second input node and an output node, wherein the first circuit module is configured to receive an input signal at the first input node and generate an amplified signal at the output node; and
a second circuit module coupled between the output node and a reference potential line, configured to draw a current from the output node in response to a first control signal;
wherein the first circuit module further comprises a switch coupled between the first input node and the second input node, and wherein the switch is configured to operate in response to a second control signal.

3. The circuit as claimed in claim 2, wherein the second control signal is in the same logic state as the first control signal.

4. The circuit as claimed in claim 3, wherein the switch comprises a MOS transistor coupled between the first input node and the second input node.

5. A circuit, comprising:
a first circuit module with a first input node, a second input node and an output node, wherein the first circuit module is configured to receive an input signal at the first input node and generate an amplified signal at the output node;
a second circuit module coupled between the output node and a reference potential line, configured to draw a current from the output node in response to a first control signal;
a controller; and
a coupler configured to couple the output node of the first circuit module to the reference potential line in response to an output of the controller.

6. The circuit as claimed in claim 5, wherein the controller is configured to generate a first bias current and a second bias current that are complementary to each other, and wherein the first circuit module comprises a first amplifier whose input bias current is mirrored from the first bias current, and the coupler comprises a second amplifier whose input bias current is mirrored from the second bias current.

7. The circuit as claimed in claim 6, wherein the controller comprises:

a current source configured to provide a constant current;
a MOS transistor coupled with the current source, having a gate, a source and a drain, biased with a variable voltage to conduct the first bias current; and
another MOS transistor coupled with the current source, having a gate, a source and a drain, biased with a fixed voltage to conduct the second bias current.

8. The circuit as claimed in claim 7, wherein the variable voltage comprises an output of a RC network coupled between the gate of the MOS transistor and the reference potential line.

9. A circuit, comprising:
a first differential amplifier having differential inputs and an output configured to be coupled to a load;
a bypass circuit coupled between the output of the first differential amplifier and a reference supply node; and
a sensing circuit configured to sense a voltage fluctuation at a power supply node and in response thereto actuate the bypass circuit to shunt the output of the first differential amplifier to the reference supply node.

10. The circuit of claim 9, further comprising a second differential amplifier configured as a voltage follower having an input coupled to the reference supply node and an output coupled to the output of the first differential amplifier.

11. The circuit of claim 10, wherein the first differential amplifier is biased by a first variable biasing current and the second differential amplifier is biased by a second variable biasing current, wherein a sum of the first variable biasing current and the second variable biasing current is a constant.

12. The circuit of claim 11, further comprising a differential comparator configured to generate first variable biasing current and the second variable biasing current in response to a comparison of a first input signal to a second input signal.

13. The circuit of claim 12, wherein the first input signal is a reference voltage signal derived from voltage at the power supply node and the second input signal is a timing signal.

14. The circuit of claim 13, wherein the timing signal is a variable voltage generated at an output of an RC network coupled between the power supply node and the reference supply node.

15. The circuit of claim 9, wherein the sensing circuit comprises a comparator circuit configured to compare a reference voltage signal derived from voltage at the power supply node to a variable timing signal derived from voltage at the power supply node.

16. The circuit of claim 15, wherein the timing signal is generated at an output of an RC network coupled between the power supply node and the reference supply node.

* * * * *